United States Patent
Kapur et al.

(10) Patent No.: US 6,513,001 B1
(45) Date of Patent: Jan. 28, 2003

(54) EFFICIENT ELECTROMAGNETIC FULL-WAVE SIMULATION IN LAYERED SEMICONDUCTOR MEDIA

(75) Inventors: Sharad Kapur, Hudson County, NJ (US); David Esley Long, Union County, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/317,118

(22) Filed: May 24, 1999

Related U.S. Application Data

(63) Continuation-in-part of application No. 08/904,488, filed on Aug. 1, 1997, now Pat. No. 6,064,808.

(51) Int. Cl.[7] .......................... G06F 17/10; G06F 7/60; G06F 17/50; G06G 7/48
(52) U.S. Cl. .................. 703/13; 703/2; 703/6
(58) Field of Search ........................ 703/13, 2, 6; 702/7

(56) References Cited

U.S. PATENT DOCUMENTS 6,115,670 A * 9/2000 Druskin et al. ................ 702/7

OTHER PUBLICATIONS

Sachdev et al; "Combined tangental–normal vector elements for computing electric and magnetic fields"; IEEE Trans. Magnetics; pp. 1456–1459; Mar. 1993.*

Beardsley; "reconstruction of the magnetization in a thin film by a combination of Lorentz Microscopy and external field measurement"; IEEE Trans. Magnetics; pp. 671–677; Jan. 1989.*

Scharstein; "Helmholtz decomposition of surface electric current in electromagnetic scattering problems"; IEEE Proc. 23rd Symp. System theory; pp. 424–426; Mar. 1991.*

Wang et al.; "Full wave analysis of microstrip floating line structures by wavelet expansion method"; IEEE Trans. MTT; pp. 131–142; Jan. 1995.*

Catedra et al.; "Spectral domain analysis of conducting patches of arbitrary geometry in multilayer media using the CG–FFT method"; IEEE Trans. Antenn. & Prop.; pp. 1530–1536; Oct. 1990.*

Horng; "An efficient current expansion technique in full–wave modeling of microstrip discontinuities of arbitrary shape"; IEEE Microwave Conf. Proc.; pp. 677–680; Dec. 1997.*

Lee et al.; "Full–wave characterization of high–Tc superconducting transmission lines"; IEEE Trans. Applied Superconductivity; pp. 49–57; Jun. 1992.*

(List continued on next page.)

*Primary Examiner*—Hugh M. Jones
(74) *Attorney, Agent, or Firm*—Hitt, Gaines & Boisbrun, PC

(57) ABSTRACT

Apparatus and method for simulating a component, where the component is conducting a current density, are disclosed. In one embodiment, the method includes discretizing the component into a plurality of triangular elements, and computing Green's functions descriptive of the relationship of the elements discretizing the component. In addition, the method includes computing basis functions relating to the elements, where the basis functions decompose the current density into divergence free and curl free parts, and the curl free parts are computed using a spanning tree. The method further includes combining the Green's functions and the basis functions to calculate a value representing a current density of said component. In one embodiment, the apparatus includes components configured to discretize the components, process Green's functions, compute basis functions, and combine the Green's functions and the basis functions to arrive at the value.

8 Claims, 3 Drawing Sheets

OTHER PUBLICATIONS

Cervelli et al.; "An impedance matrix transformation for planar circuit integral equation solvers"; IEEE Microwave Symp. Digest; pp. 1559–1562; Jun. 1998.*

Sercu et al.; "Efficient calculation technique for the impedance matrix equation in the MPIE teachnique for microstrip and slotline planar structures of arbitrary shape"; IEEE Antenn, & Prop. Int. Symp.; pp. 350–353; Jun. 1993.*

Petre et al.; Scatteing from arbitrary planar periodic screen consisting of resisyive patches and dielectric layers; IEEE Antenn & Prop. Soc. Int. Symp.; pp. 1870–1873; Jun. 1991.*

Brown et al.; "Simple meshing and efficient numerical analysis of curved surfaces using a new quadrilateral basis function."; IEEE Anntenn. & Prop. Soc. Int. Symp.; pp. 290–293; Jun. 1998.*

Chan et al.; "The propagation characteristics of signal lines embedded in a multilayered structure in the presence of a periodically perforated ground plane."; IEEE Trans. MTT; pp. 968–975; Jun. 1988.*

Catedra et al.; "A new conjugate gradient–fast fourier transform (CG–FFT) Scheme for analysis and design of flat metallic periodic structures"; IEEE Antenn. & Prop. Soc. Int. Symp.; pp. 99–102; Jun. 1988.*

Kooij et al.; "Nonlinear inversion of a buried object in TE–scattering"; IEEE Antenn. & Prop. Soc. Int. Symp.; pp. 2617–2620; Jul. 1997.*

Wang et al.; "Numerical modeling of V–shaped linearly tapered antennas"; IEEE Antenn. & Prop. Soc. Int. Symp.; pp. 1118–1121; Jul. 1997.*

Rautio; "Triangular cells in an electromagnetic analysis of arbitrary microstrip circuits"; IEEE MTT–S; pp. 701–704; May 1990.*

Horng et al.; "A unified method for characterization of microstrip and waveguide discontinuities of irregular shape"; IEEE MTT–S; pp. 1815–1818; Jun. 1997.*

J.D. Horton; "A Polynomial–Time Algorithm to Find the Shortest Cycle Basis of a Graph"; Siam J. on Computing, vol. 16, No. 2; Apr. 1987; pp. 358–366.

* cited by examiner

EFFICIENT ELECTROMAGNETIC FULL-WAVE SIMULATION IN LAYERED SEMICONDUCTOR MEDIA

CROSSREFERENCES

This application is a continuation in part of U.S. patent application Ser. No. 08/904,488, now U.S. Pat. No. 6,064,808 filed Aug. 1, 1997, titled Method and Apparatus for Designing Interconnections and Passive Components in Integrated Circuits and Equivalent Structures by Efficient Parameter Extraction.

FIELD OF INVENTION

This invention is in the field of simulation, or parameter extraction of characteristics of electrical elements used in the design of printed circuit boards, and solid state integrated circuits.

BACKGROUND OF THE INVENTION

Parameter extraction, or simulation, of electronic elements has a significant role in the design of modern integrated circuits (IC) operating increasingly at frequencies in the range of hundreds of megahertz. Increasing IC operating frequencies, coupled with reduced, submicron size structures, have made "full-wave" simulation critical for components created within an IC that may be operated near resonance.

As described in the parent application, Ser. No. 08/904,488, incorporated herein by reference in its entirety, historically, capacitive and inductive elements were computed from the geometry of an IC by using general purpose field solvers based on finite-difference or finite-element method. Typical of these tools of the prior art is a requirement for volume and/or area discretization. In this case, solutions had to be computed for large numbers of points descriptive of electric and/or magnetic fields of an element within a device. Using this approach, as frequencies go up, the number of elements requiring solution for a practical "full wave" simulation also goes up resulting in large computation time and memory use for the completion of one simulation.

Another approach in the prior art used simulation tools based on layered media integral equation formulations. These are typically used in the microwave and antenna communities. However, these tools employ direct solution methods which restricts them to small problems. In addition, the formulations that they are based on become ill-conditioned at lower frequencies, resulting in numeric difficulties.

Yet another approach of the prior art is the use of integral equation schemes. An example of this approach is FastCap: A multipole accelerated 3-D capacitance extraction program *IEEE Transaction on Computer Aided Design* 10(10):1447–1459, November 1991, incorporated herein by reference in its entirety. In general, integral equation schemes work by introducing additional equations to enforce boundary conditions at region interfaces. The introduction of multiple equations for multiple boundary conditions can result in a prohibitive increase in problem size again presenting problems with computation time and memory usage.

Another approach of the prior art to solve parameter extraction problems is the use of layered Green's functions. These functions have traditionally been used in a 2.5D simulation context where the radiating sources are essentially planar, being confined to infinitely thin sheets. This approach has been popular in the microwave and antenna communities. For these communities, 2.5D modeling of the structures is adequate because generally conductor thickness is much smaller than the width. However, in IC and packaging contexts planar modeling is generally insufficiently accurate. Shrinking IC geometry size approaching submicron dimensions dictates that thickness of conductors within an IC is often on the same order as the width. This physical characteristic of internal IC structures reduces the applicability of a strictly planar oriented approach by introducing substantial errors.

SUMMARY OF THE INVENTION

Above listed problems are avoided in accordance with one aspect of the invention by an apparatus simulating a component, where the component is conducting a current density. The apparatus has means for discretizing the component into a plurality of triangular elements, a means for computing Green's function descriptive of the relationship between the elements, a means for computing basis functions relating to said elements, where the basis functions decompose the current density into divergence free and curl free parts, and means for combining the Green's functions and the basis functions to arrive at the solution to the integral equation representative of the component to be simulated.

The basis functions are computed from rooftop functions formed from the elements. The basis functions, b, constructed using spanning tree T, rooftop functions, h, and triangular elements, t, are used to compute:

Ohmic interactions among the rooftop functions in an h×h sparse matrix $\Omega$;

vector potential interactions among the rooftops functions in an h×h dense matrix A;

scalar potential interactions among said rooftop functions in an t×t dense matrix $\Phi$;

a h×b sparse matrix V;

and a t×b sparse matrix S descriptive of the divergence of each of the basis function b to express a matrix B representative of the interaction between the basis functions within the component, as represented by $$B=V^T(-\Omega-j\omega A)V-S^T\Phi S$$

A preconditioner P is used to compute an approximation to the inverse of the resulting B matrix $$P=V^T(-\Omega-j\omega \tilde{A})V-S^T\tilde{\Phi}S$$

where $\tilde{\Phi}$ contains the self interactions among said rooftop functions, and $\tilde{A}$ contains the interactions among the rooftop functions and interactions between the rooftops that share one of the triangular elements.

The inverse of B, containing the necessary information for computing parameters of the component of interest is computed by using the sparse preconditioner P as an approximation to be used iteratively to solve:

$$P^{-1}Bx=P^{-1}s$$

where s is a stimulus.

BRIEF DESCRIPTION OF THE DRAWING

These and other features of the invention will become apparent from the following description and claims, when taken with the accompanying drawings, wherein similar reference characters refer to similar elements throughout, and in which:

DETAILED DESCRIPTION

Figure 2:
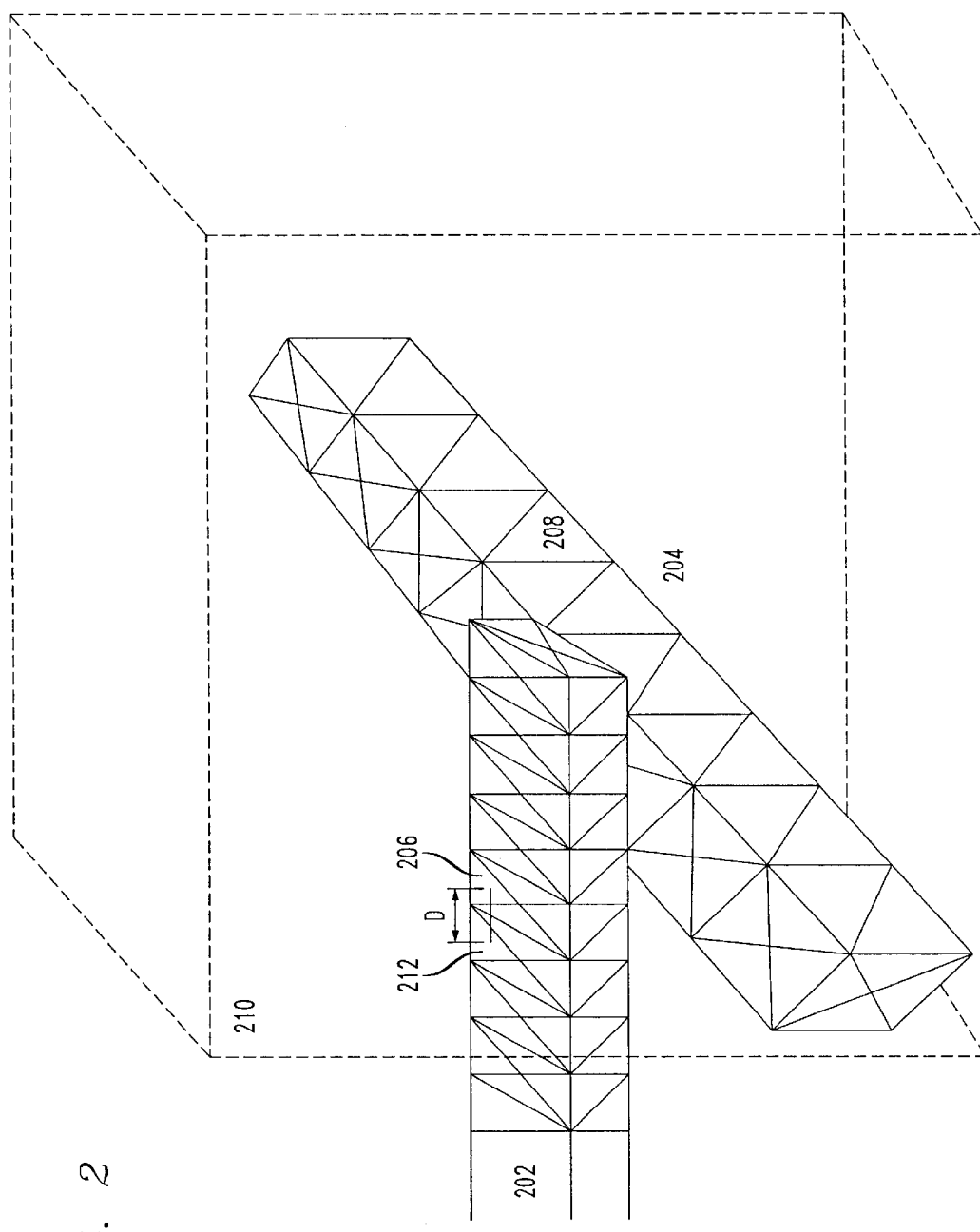
FIG. 2 is a layered structure showing discretized regions.

An overview of the method and apparatus used in the invention will be presented before describing the illustrative embodiments of each component of the design tool in accordance with this invention, In accordance with this invention, a structure to be modeled, as for example shown in FIG. 2, typically an IC component, is first discretized into many parts. The discretization process for this invention divides the IC component into relatively small, triangular elements. The elements can be viewed as a mesh descriptive of the element itself. Typical of integral equation approaches used in this invention is surface discretization.

Figure 1:
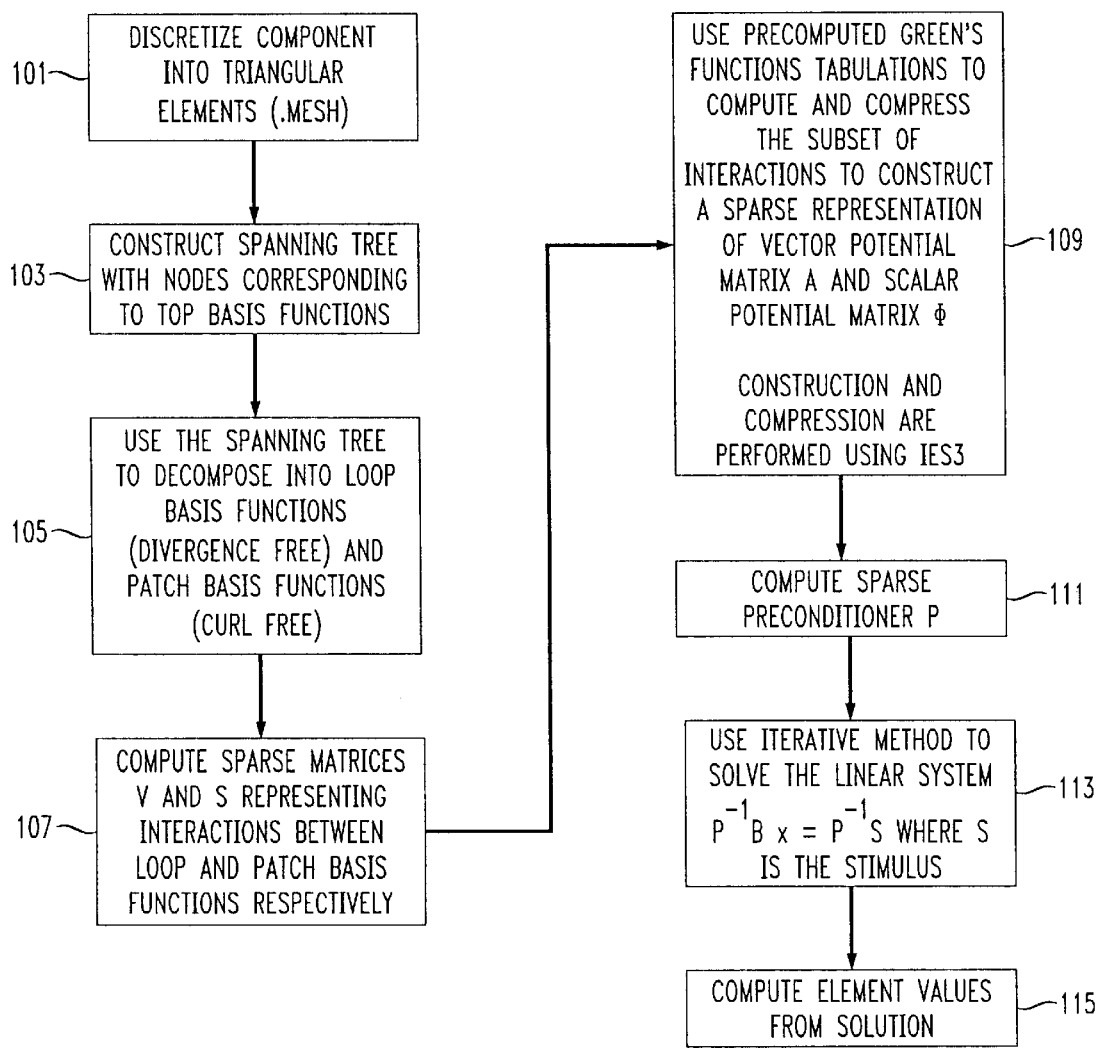
FIG. 1 is a flow diagram of the simulation tool of the present invention.

As shown in FIG. 1, in block 101, the surface of a component of interest is discretized into triangular elements. Such a discretization is illustrated in FIG. 2, where component 202 and component 204 are discretized. For example, component 202 has triangular elements 212 and 206, while component 204 has triangular element 208. A method of moments, generally identified as a Galerkin type, as described by R. F. Harrington, in *Field Computation by Moment Methods*, IEEE press, New York 1991 is used in conjunction with the triangular elements. Components 202 and 204 are within volume 210.

Figure 3:
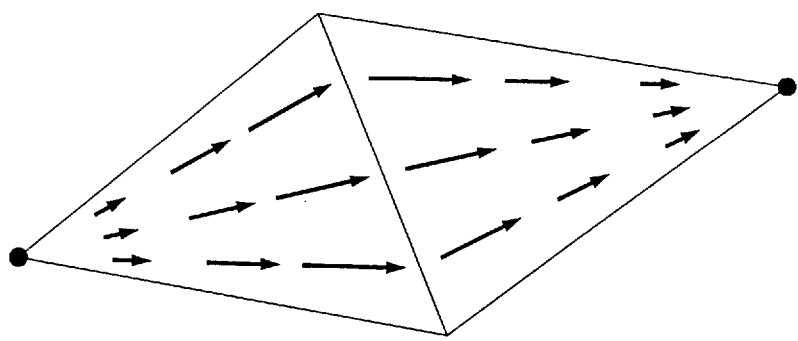
FIG. 3 are two adjacent rooftop functions used in the tool of this invention.

Returning to FIG. 1, construct a spanning tree with nodes corresponding to rooftop functions and edges corresponding to connections between rooftop functions, as outlined in block 103. An example of a rooftop function is shown in FIG. 3.

Once the element of interest is discretized, Green's function for each pair of elements is computed. Green's function is descriptive of the effects of each source to observation point interaction and is independent of all others. Thus, a system of equations in the spectral domain, (i.e. Green's functions), can be chosen to represent the relationship between all possible "sources" and "observation points" within a structure at an arbitrary level of discretization.

Basis functions are now computed from rooftop functions. In accordance with block 103, a spanning tree is constructed with nodes corresponding to basis functions. It is the ability of the specially computed basis functions to decompose the current density into divergence free and curl free parts that facilitates the simulation of a component in accordance with this invention.

A matrix B is computed, where B is representative of the interactions between basis function in block 103. Matrix B is, in general, a representation of the electric field integral equation (see equation 7 below) incorporating the teachings of this invention.

To arrive at the values of the component of interest, matrix B has to solved. To do this, it has been found advantageous to use a preconditioner P in conjunction with an iterative solution method.

The solution of the integral field equation allows the calculation of component values.

For the purposes of this invention, a "two-and-a-half dimension" approach is used, wherein thin conductors are characterized by a surface conductivity $\sigma$. If a time-harmonic steady-state solution is assumed, then, in the frequency domain, the electric field $\vec{E}$ is expressed in terms of the vector potential $\vec{A}$ and the scalar potential $\phi$:

$$\vec{E}(\vec{r}) = \vec{E}_{inc}(\vec{r}) - j\omega\vec{A}(\vec{r}) - \nabla\phi(\vec{r}) \tag{1}$$

$\vec{E}_{inc}$ is an incident (stimulus) field. The vector and scalar potentials are obtained by integrating over the conductor surfaces:

$$\vec{A}(\vec{r}) = \int_S \vec{\vec{G}}^A(\vec{r}, \vec{r}\,') \vec{J}(\vec{r}\,') dS', \tag{2}$$

and $$\phi(\vec{r}) = \int_S G^\phi(\vec{r}, \vec{r}\,') \rho(\vec{r}\,') dS'. \tag{3}$$

$\vec{J}$ is the surface current density, $\rho$ is the surface charge density, $\vec{\vec{G}}^A$ is the (dyadic) vector potential Green's function, and $G^\phi$ is the scalar potential Green's function. In free space $$\vec{\vec{G}}^A(\vec{r}, \vec{r}\,') = \frac{\mu_0}{4\pi} \frac{e^{-j\omega|\vec{r}-\vec{r}\,'|/c}}{|\vec{r} - \vec{r}\,'|} \vec{I}, \text{ and} \tag{4}$$

$$G^\phi(\vec{r}, \vec{r}\,') = \frac{1}{4\pi\epsilon_0} \frac{e^{-j\omega|\vec{r}-\vec{r}\,'|/c}}{|\vec{r} - \vec{r}\,'|}, \tag{5}$$

where c is the speed of light and $\epsilon_0$ and $\mu_0$ are the permittivity and permeability of vacuum respectively. The surface divergence of the current density $\vec{J}$ is related to the charge density $\rho$ by $$\nabla_s \cdot \vec{J}(\vec{r}) + j\omega\rho(\vec{r}) = 0. \tag{6}$$

At the surface of a conductor, the current density is given by $\vec{E} = \vec{J}/\sigma$. Combining this relation with Equation (1) yields $$-\vec{J}(\vec{r})/\sigma - j\omega\vec{A}(\vec{r}) - \nabla\phi(\vec{r}) = -\vec{E}_{inc}(\vec{r}). \tag{7}$$

Equation (7), known as the electric field integral equation, is generally discussed by W. C. Chew in *Waves and Fields in Inhomogenous Media*, IEEE press, NY 1995, and is used in the present invention to solve for the current $\vec{J}$.

Discretization

As further detail of block 101, for the numerical solution of the equations, it was found that the structure to be modeled is best discretized into triangular elements as generally discussed by J. R. Shewchuk in Triangle: Engineering a 2 D quality mesh generator and Delauney triangulator First Workshop on Applied Computational Geometry, pg 124–133, Association of Computing Machinery, May 1996. This is used with a method of moments using Galerkin-type tools as generally described by R. F. Harrington in *Field Computation by Moment Methods IEEE* press, NY, 1991.

The individual basis functions are composed of Rao-Wilton-Glisson subsectional rooftop functions as generally discussed by S. M. Rao, D. R. Wilton, and A. W. Glisson in *Electromagnetic Scattering by Surfaces of Arbitrary Shape*

*IEEE Transactions on Antenna and Propagation*, AP-30:409–418 May 1982.

A rooftop function for a triangle t is zero outside of t. At a point $\vec{r}$ inside of t, the function is given by $d(\vec{r}-\vec{v})$, where $\vec{v}$ is one of the vertices of t (the origin for the rooftop) and d is a scaling factor. The function represents current flow across the edge opposite $\vec{v}$, and the scaling factor is chosen so that the total current flow out of t is one unit. A pair of rooftop functions (one positive and one negative) represent the current flow between two triangles as shown in FIG. 3.

Avoiding Ill Conditioning

In the Rao-Wilton-Glisson formulation, pairs of rooftop functions are used to represent the current flow across each interior edge in the discretization. At high frequencies this gives acceptable results, but there are serious problems at low frequencies, generally related to approaching of singularities, sometimes referred to as "ill-conditioning". Low frequency, in this context, refers to the size of the structure being a fraction of a wavelength. The cause of the ill conditioning becomes defined from analysis of equation (7). The left-hand side becomes $$-\frac{\vec{J}(\vec{r})}{\sigma} - j\omega \int_S \vec{\vec{G}}^A(\vec{r},\vec{r}')\vec{J}(\vec{r}')dS' + \frac{1}{j\omega}\nabla\int_S G^\phi(\vec{r},\vec{r}')(\nabla_S \cdot \vec{J}(\vec{r}))dS'.$$

The inventors noted that the last term (the gradient of the scalar potential) becomes numerically dominant at low frequencies. Without special precautions, all other terms are swamped, and inverting the matrix would require reconstructing $\vec{J}$ only from its surface divergence.

While this ill conditioning causes a loss of accuracy for direct factorization solution methods, for typical frequencies and structure sizes of interest in RF IC applications it is usually not fatal. However, the ill-conditioning precludes the use of desirable iterative methods, since their performance is strongly dependent on the conditioning of the linear system.

In order to avoid the fatal limitation imposed by ill conditioning in iterative methods, this invention describes a set of basis functions that decompose the current density into divergence-free and curl-free parts. The divergence-free basis functions represent current loops. Because they have zero divergence, they do not contribute to the scalar potential, and they are not affected by it. As a result, the linear system decouples at low frequencies, with the equations corresponding to the loops representing a magnetostatic problem.

Generating Basis Functions

In accordance with block 103 in FIG. 1, the basis functions are generated by first constructing a graph G whose nodes are elements of the discretization and whose edges represent connections between elements. Then, a spanning tree T is computed in G. This spanning tree is used to construct the curl-free, or patch, basis functions in accordance with block 105 in FIG. 1. An orientation to each edge is arbitrarily assigned (u, v) in T. A pair of rooftop functions are used to represent a current flowing out of triangle u and into triangle v. For the divergence-free, or loop, basis functions the current flow in an arbitrary loop in the structure is represented. To this end, a cycle basis C for G is computed, as generally described by J. D. Horton in *A polynomial-time algorithm to find the shortest cycle basis of a graph* SIAM J. Comput., 16(2):358–366, April 1987.

The most common way to construct a cycle basis is to use the spanning tree T. Pick an arbitrary node and designate it as the root of T, then each edge (u, v) in G that is not in T defines a cycle as follows:

a) Beginning at the root, follow the unique path in T from the root to u, then b) cross (u, v), and follow the unique path in T from v back to the root.

Unfortunately, this tends to produce large cycles, even if T has been constructed in a breadth-first manner. This is undesirable for reasons that will be discussed in the section labeled Preconditioning.

It was found by the inventors that much shorter cycles can be obtained using a heuristic method generally proposed by Horton, as referenced above, *A polynomial-time algorithm to find the shortest cycle basis of a graph* SIAM J. Comput., 16(2):358–366, April 1987.

The types of graphs that arise from boundary meshes tend to be nearly planar. For such graphs, Horton's heuristic can be implemented so as to run in roughly linear time, and the bases that it produces are nearly minimal.

Now construct one divergence-free basis function for each loop in the cycle basis C. The loop is assigned an arbitrary orientation, the edges are oriented to match the loop orientation, and each edge becomes a pair of rooftop functions as discussed above.

Expanding the current $\vec{J}$ using the basis functions and testing against the same functions in a standard fashion as detailed in the Harrigton reference cited supra, gives a linear system Bx=s, where x is the vector of basis function coefficients and s comes from the stimulus. There is one particular advantage to using the rooftop functions: when testing the gradient of the scalar potential in equation (7), it is possible to use an identity to eliminate the gradient operator as generally explained by S. M. Rao, D. R. Wilton, and A. W. Glisson in *Electromagnetic Scattering by Surfaces of Arbitrary Shape IEEE Transactions on Antenna and Propagation*, AP-30:409–418, May 1982. This discovery simplifies that portion of the computation considerably.

Stimuli

The notion of having an incident field $\vec{E}_{inc}$ is known for use in scattering problems. A known approach is to allow voltage and current sources which are connected to ports. Various methods of implementing voltage and current sources have been considered such as the Harrington reference above, but all lead to low frequency ill conditioning because current loops that pass completely through the structure are not captured by divergence-free basis functions.

One aspect of this invention that teaches away from the prior art details how to implement sources while avoiding this ill conditioning problem. Since both types of sources are handled by similar techniques, the description herein is limited to only voltage sources.

Figure 4:
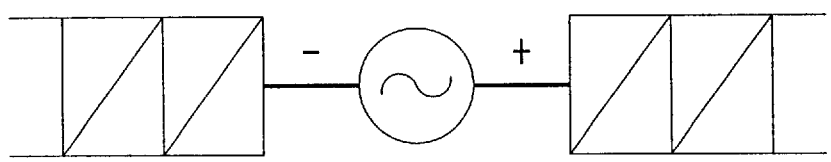
FIG. 4 shows an equivalent circuit used to detail a step in the present invention.
Figure 5:
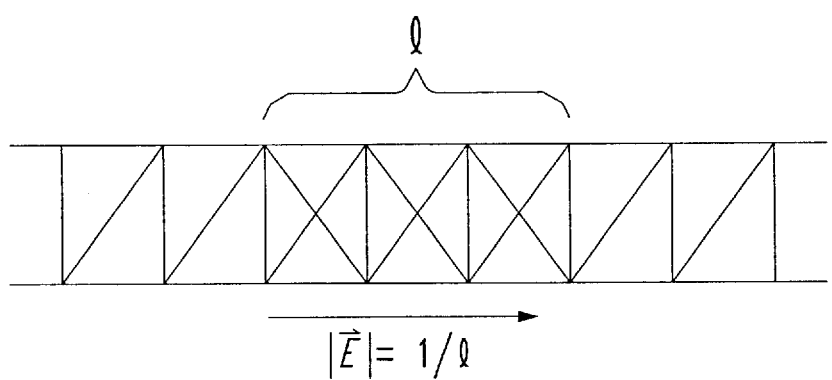
FIG. 5 shows an equivalent structure used to detail a step in the present invention.

To understand the formulation, consider the two ports in FIG. 4 with a one-volt source between them. One way to model this configuration is to physically add a conductor of length l to bridge the two ports. Then, apply a uniform incident field of strength 1/l in the region of the bridge, as shown in FIG. 5. Consider now a divergence-free basis function passing through the bridge. Within the bridge, the basis function is simply a unit current flow that is parallel to the incident field. Hence, testing the incident field using this basis function will just give 1·(1/l)=1. However, since the bridge region is an artifact to model the source, the current flow within the bridge should not affect the electric fields in the rest of the structure. If the contributions of the triangles in the bridge are dropped, the effect of the source between the ports is:

(1.) to add (to the connectivity graph G) a "source edge" that links the triangles at the ends of the ports to the connectivity graph G; and (2.) to add ±1 to the components of the right-hand side corresponding to basis functions that pass through the source edge.

The sign of each contribution depends on the orientation of the source relative to the direction of current flow for the basis function.

Modeling Voltage Sources

More generally, consider the case of a multiport structure with each port connected by a voltage source to a ground which is located at infinity. Add a new node to G representing the ground, and connect the nodes for the ports to this new node with source edges. Then generate divergence-free and curl-free basis functions as described in the subsection describing the generation of basis functions, supra.

When a basis function traverses a source edge, include only a single rooftop function for that edge. (The other rooftop would correspond to the ground node.) Also, add (or subtract) the source's value to the component of the right-hand side for that basis function. Note that once the linear system is solved, the current is obtained for the source directly from the coefficients of the basis functions that pass through that source. Because all possible current loops through the structure can be expressed using divergence-free basis functions, ill conditioning is avoided.

By setting the first voltage source to one and all others to zero and solving to obtain the source currents, the first column of the structure's admittance matrix is extracted. Repeating this procedure for all sources gives the complete matrix in accordance with block 107 of FIG. 1.

Solution

Solving the system of equations Bx=s by direct factorization, with its cubic time complexity, is time consuming for large problems. Because of the present invention, the system of equations is well conditioned, thus apply Krylov-subspace iterative methods as described by Y. Saad, in *Iterative Methods for Sparse Linear Systems* PWS publishing 1996, to find the solution. For iterative methods, multiplication with the method-of-moments matrix B has to be completed. Since the number of iterations needed is small, the time required is proportional to the time required to do one multiply. With a direct representation of B, this time is still quadratic with respect to problem size. For problems with more than a few thousand basis functions, this is still not feasible due to time constraints.

To avoid this quadratic complexity, we apply the $IES^3$ methods of the matrix compression algorithm of the referenced parent application. $IES^3$ allows compression of dense matrices representing interactions between pairs of elements in cases where the interactions vary smoothly with distance. In such cases, with an appropriate ordering of elements, large parts of the interaction matrix are numerically low-rank. The ordering should be chosen so that close spatial separation corresponds to closeness in the ordering. The low-rank regions of the matrix are represented as sparse outer products using the singular value decomposition (SVD). In $IES^3$, the matrix is recursively partitioned, sampled and compressed. The time and memory required to compress the matrix with $IES^3$ is only $O(N \log N)$, where N is the matrix dimension. The time to do a matrix multiply using the compressed representation is also $O(N \log N)$. The entire matrix need not be built before applying $IES^3$: only a function that will compute a specified entry on demand is computed.

Matrix Decomposition

The method-of-moments matrix B represents the interaction between pairs of basis functions. These interactions can be expressed in terms of interactions among pairs of rooftop functions. Note though that any given rooftop may be used in many basis functions, and hence there is a danger that the interaction between a pair of rooftops may be computed many times. If B were represented directly as a dense matrix, any duplication of effort could be avoided by computing the interactions of a pair of rooftops and adding the result to all the entries in B that involve that pair. However, since $IES^3$, described in the parent application, requires that complete matrix entries be provided in a particular order, this strategy cannot be used. Instead, the duplication is eliminated by decomposing B into simpler matrices. Consider again the equation being discretized:

$$-\frac{\vec{j}}{\sigma} - j\omega\vec{A} - \nabla\phi = -\vec{E}_{inc}.$$

The left-hand side of the equation consists of an Ohmic interaction part, a vector potential interaction part, and a scalar potential interaction part. B will be decomposed into these same three parts. Let b be the number of basis functions, h be the number of rooftop functions and t be the number of triangles. Then:

(1) Ohmic interactions among the individual rooftop functions can be captured by an h×h sparse matrix $\Omega$;

(2) vector potential interactions among the rooftops are given by an h×h dense matrix A; and (3) scalar potential interactions are captured by a t×t dense matrix $\Phi$. (These interactions only form a t×t matrix since charge is a scalar quantity.)

The composition of basis functions in terms of rooftops is expressed by an h×b sparse matrix V. Multiplying a vector of basis function coefficients by V produces a vector of rooftop function coefficients. Similarly, the divergence of each basis function is expressed by the t×b sparse matrix S. The columns of S that correspond to divergence-free functions consist of all zeros. Given these matrices, B is written as $$B = V^T(-\Omega - j\omega A)V - S^T \Phi S.$$

$IES^3$ is used to compress the dense matrices A and $\Phi$. Multiplying a vector by B can be accomplished using a combination of products with the sparse matrices V, $\Omega$, and S and with the compressed matrices A and $\Phi$ in accordance with block 109 of FIG. 1.

Although there are some strong off-diagonal interactions, the rank map is typical in problems where the time and memory requirements for constructing A drop from $O(h^2)$ to $O(h \log h)$. In practice, this $O(h \log h)$ cost dominates the complexity of the entire solution procedure. Most of the CPU time goes into evaluating the integrals associated with the rooftop function interactions. These integrals are computed using low-order Gaussian quadratures on triangles, as for example, shown by A. H Stroud in *Gaussian Quadrature Formulas*, Prentice Hall, New York 1966 for distant interactions, adaptive Gaussian integration for close interactions, and analytic singularity removal plus adaptive Gaussian correction for self interactions.

Preconditioning

As mentioned above, at low frequencies, the matrix B decouples into two parts: one involving interactions between curl-free basis functions, and the other giving interactions between divergence-free basis functions. The submatrix corresponding to the former is numerically large, while the submatrix corresponding to the later is numerically small. Because of the difference in scaling between these two parts, a "preconditioner" is applied, in accordance with this invention, in a manner as generally described by Y. Saad, in *Iterative Methods for Sparse Linear Systems*, PWS publishing, 1996. This will lead to an accurate linear solution. A preconditioner is a matrix P for which $P^{-1}$ is an approximation to the inverse of B in accordance with block 111 of FIG. 1. Solving iteratively $BP^{-1}$ y=s, gives the solution to the original problem as $P^{-1}$ y in accordance with block 113 of FIG. 1.

Empirically, the following preconditioning strategy was discovered to work well:

a) Construct sparse matrices $\tilde{A}$ and $\tilde{\Phi}$ from A and $\Phi$ that contain only the self interactions among rooftops. For $\tilde{A}$, interactions between rooftops that share the same triangle are also included.

b) Compute the sparse preconditioner $$P=V^T(-\Omega-j\omega\tilde{A})V-S^T\tilde{\Phi}S.$$

c) Apply a standard sparse LU factorization to compute solutions with P. Note that sparsity in P is strongly influenced by sparsity in V. This is why constructing a small cycle basis, as discussed above is important.

Iterative Solver

One possibility to arrive at an iterative solution in conjunction with this invention is to use a block version of a GMRES iterative solver, as described by Y. Saad, in *Iterative Methods for Sparse Linear Systems* PWS publishing 1996, A GMRES block solver is most natural because it will arrive at solution per port when extracting the admittance matrix of the structure. In addition, block solvers have two efficiency advantages. First, they tend to reduce the average number of iterations per right-hand side since the solutions are being sought in a larger Krylov subspace. Second, when doing block multiplies with the compressed A and $\Phi$ matrices, advantage can be taken of optimized matrix-matrix product routines which have excellent floating-point performance.

The iteration method uses the sparse preconditioner P to iteratively solve $$P^{-1}Bx=P^{-1}s$$

where s is the stimulus. Once solved, B contains the information required to compute the element values in accordance with block 115 of FIG. 1.

Implementation

In general, an apparatus in accordance with this invention is implemented in a general purpose computer. In the alternative, a special purpose computer performing the same operations is also envisioned as a possible implementation. Within a typical computer, various processes are run to implement the functions described. First, the component of interest is modeled and discretized into a plurality of triangular elements. Then, Green's functions are computed descriptive of the relationship of the elements discretizing the component. Next, basis functions are computed relating to the elements. The basis functions decompose the current density into divergence free and curl free parts. The Green's functions and the basis functions are combined to simulate the characteristics of the component.

All references cited in this document are incorporated herein by reference in their entirety.

Although presented in exemplary fashion employing specific embodiments, the disclosed structures are not intended to be so limited. Those skilled in the art will also appreciate that numerous changes and modifications could be made to the embodiment described herein without departing in any way from the invention. For example, basis functions could be modified to allow lesser decoupling between the curl free and divergence free parts of this invention while preserving the concept presented herein. These changes and modifications and all obvious variations of the disclosed embodiment are intended to be embraced by the claims to the limits set by law.

What is claimed is:

1. An apparatus simulating a component, said component conducting a current density, said apparatus comprising:
   discretizing means for discretizing said component into a plurality of triangular elements;
   processor means for computing Green's functions descriptive of the relationship of said elements discretizing said component;
   computing means for computing basis functions relating to said elements, said basis functions decomposing said current density into divergence free and curl free parts, said curl free parts computed using a spanning tree; and
   combining means for combining said Green's functions and said basis functions to calculate a value representing a current density of said component.

2. An apparatus as described in claim 1 wherein said basis functions are computed from rooftop functions formed from said elements.

3. An apparatus as described in claim 2 wherein said basis functions, b, constructed using spanning tree T, said rooftop functions, h, and said triangular elements, t, are used to compute:
   Ohmic interactions among said rooftop functions in an h×h sparse matrix $\Omega$;
   vector potential interactions among said rooftops functions in an h×h dense matrix A;
   scalar potential interactions among said rooftop functions in an t×t dense matrix $\Phi$;
   a h×b sparse matrix V;
   and a t×b sparse matrix S descriptive of the divergence of each of said basis function b to express a matrix B representative of the interaction between said basis functions within said component as represented by $$B=V^T(-\Omega-j\omega A)V-S^T\Phi S.$$

4. An apparatus as described in claim 3 wherein a preconditioner P is computed by $$P=V^T(-\Omega-j\omega\tilde{A})V-S^T\tilde{\Phi}S$$

where $\tilde{\Phi}$ contains the self interactions among said rooftop functions, and $\tilde{A}$ contains the interactions among said rooftop functions and interactions between said rooftops that share one of said triangular elements, and said preconditioner P is an approximation to be used iteratively to solve $$P^{-1}Bx=P^{-1}s$$

where s is a stimulus.

5. A method from simulating a component, said component conducting a current density, said method comprising:
   discretizing said component into a plurality of triangular elements, computing Green's functions descriptive of the relationship of said elements discretizing said component;

computing basis functions relating to said elements, said basis functions decomposing said current density into divergence free and curl free parts, said curl free parts computed using a spanning tree; and combining said Green's functions and said basis functions to calculate a value representing a current density of said component.

6. A method as described in claim 5 wherein said basis functions are computed from rooftop functions formed from said elements.

7. A method as described in claim 6 wherein said step of computing basis functions, b, constructed using spanning tree T, said rooftop functions, h, and said triangular elements, t, are used to compute:

Ohmic interactions among said rooftop functions in an h×h sparse matrix $\Omega$;

vector potential interactions among said rooftops functions in an h×h dense matrix A;

scalar potential interactions among said rooftop functions in an t×t dense matrix $\Phi$;

a h×b sparse matrix V;

and a t×b sparse matrix S descriptive of the divergence of each of said basis function b to express a matrix B representative of the interaction between said basis functions within said component as represented by $$B = V^T(-\Omega - j\omega A)V - S^T \Phi S.$$

8. A method as described in claim 7 wherein a preconditioner P is computed by $$P = V^T(-\Omega - j\omega \tilde{A})V - S^T \tilde{\Phi} S$$

where $\tilde{\Phi}$ contains the self interactions among said rooftop functions, and $\tilde{A}$ contains the interactions among said rooftop functions and interactions between said rooftops that share one of said triangular elements, and said preconditioner P is an approximation to be used iteratively to solve $$P^{-1}Bx = P^{-1}s$$

where s is a stimulus.

* * * * *